United States Patent [19]
Kataoka

[11] Patent Number: 5,877,694
[45] Date of Patent: Mar. 2, 1999

[54] INDICATING INSTRUMENT AND METHOD OF OPERATION THEREOF

[75] Inventor: Masami Kataoka, Anjo, Japan

[73] Assignee: Nippondenso Co., Ltd., Kariya, Japan

[21] Appl. No.: 610,063

[22] Filed: Feb. 29, 1996

[30] Foreign Application Priority Data

Mar. 15, 1995 [JP] Japan ................................. 7-056157

[51] Int. Cl.⁶ .............................. G08B 21/00; H02P 8/00
[52] U.S. Cl. ........................ 340/688; 318/685; 318/696
[58] Field of Search ................................. 340/658, 659, 340/660, 664, 668, 688; 364/571.01; 324/154 R, 146, 151; 318/685, 696

[56] References Cited

U.S. PATENT DOCUMENTS

| | | | |
|---|---|---|---|
| 4,501,981 | 2/1985 | Hansen | 310/49 R |
| 4,553,093 | 11/1985 | Chikasue | 324/169 |
| 5,119,320 | 6/1992 | Ito et al. | 364/571.01 |
| 5,214,597 | 5/1993 | Ito et al. | 364/571.01 |
| 5,223,791 | 6/1993 | Umerhara | 324/146 |
| 5,287,050 | 2/1994 | Kronenberg et al. | 318/696 |
| 5,333,371 | 8/1994 | Mittenbuhler et al. | 29/595 |

FOREIGN PATENT DOCUMENTS

| | | |
|---|---|---|
| 43 10 060 | 9/1993 | Germany . |
| 6-038593 | 2/1994 | Japan . |
| 7-072177 | 3/1995 | Japan . |

*Primary Examiner*—Jeffery A. Hofsass
*Assistant Examiner*—Van T. Trieu
*Attorney, Agent, or Firm*—Pillsbury Madison & Sutro LLP

[57] ABSTRACT

An indicator of a meter is driven by a step motor in which a rotating magnetic field formed by field coils which is a composite of magnetic fields of the coils supplied with a sine-wave-driving current and cosine-wave driving current. The indicator is also returned to a stopper located at a zero position of the meter by the rotating magnetic field. A part of the rotating magnetic field, which is formed from the sine and cosine waves in a range of the phase angle between −340 degree and −(180 degree−Δa degree) in the zero-return process, is cut after the indicator rests on the stopper so that such part of the rotating magnetic field may not separate the indicator from the stopper.

11 Claims, 10 Drawing Sheets

PHASE ANGLE OF COS AND SIN WAVE CURRENT IN BACKWARD DIRECTION

PHASE ANGLE OF COS AND SIN WAVE CURRENT
IN BACKWARD DIRECTION

FIG. 12 (PRIOR ART)

PHASE ANGLE OF COS AND SIN WAVE CURRENT
IN BACKWARD DIRECTION

INDICATING INSTRUMENT AND METHOD OF OPERATION THEREOF

CROSS REFERENCE TO RELATED APPLICATION

The present application is based on and claims priority from Japanese Patent Application Hei 7-56157, filed on Mar. 15, 1995, the contents of which are incorporated herein by reference.

BACKGROUND OF THE INVENTION

1. Field of the Invention

The present invention relates to an indicating instrument and, more particularly, relates to an indicating instrument driven by a step motor and a method of operation thereof.

2. Description of Related Art

An indicating instrument which is driven by a two-phase-magnetic-field type step-motor has been used for a vehicle. The step motor of such indicating instrument has a pair of annular stators, each of which has a ring-shaped winding and a plurality of magnetic poles, and a permanent magnet rotor which has the same number of magnetic poles as each of the stator. The poles of one stator are disposed respectively between the poles of the other stator, and one of the windings is energized with a sine-wave current and the other is energized with cosine-wave current at the same time. A rotating magnetic field is generated by the stator changes as both current supplied to the windings change sinusoidally so that the permanent magnet rotor is driven in a direction and an indicator or a pointer of the indicating instrument moves together with the magnet rotor. The indicator is, usually, adjusted to stay at a zero position when it is manufactured.

If, however, a shock is applied to the indicating instrument before shipment, the magnet rotor may be rotated and the indicator may be separated remote from the zero position and may not be returned to the zero position.

The indicating instrument disclosed in Japanese Patent Laid Open Hei 6-38593 has a stopper located near the zero position, and a sine-wave current and cosine-wave current are supplied to the respective windings as zero-return current to form a backward-rotating-magnetic-field thereby to bring the magnet rotor and the indicator back to the zero position and rest on the stopper before the indicator instrument starts operation (forward rotation) so that the indicator can start moving from the zero position.

However, if the backward-rotating-field remains in a period longer than about a half cycle while the indicator and the magnet rotor are caught by the stopper, magnetic force of the rotating field moves opposite side of the indicator and drives the magnet rotor to separate the indicator from the stopper again. As a result, the indicator can not start from the zero position when it is operated for a normal use (forward rotation).

Figure 12:
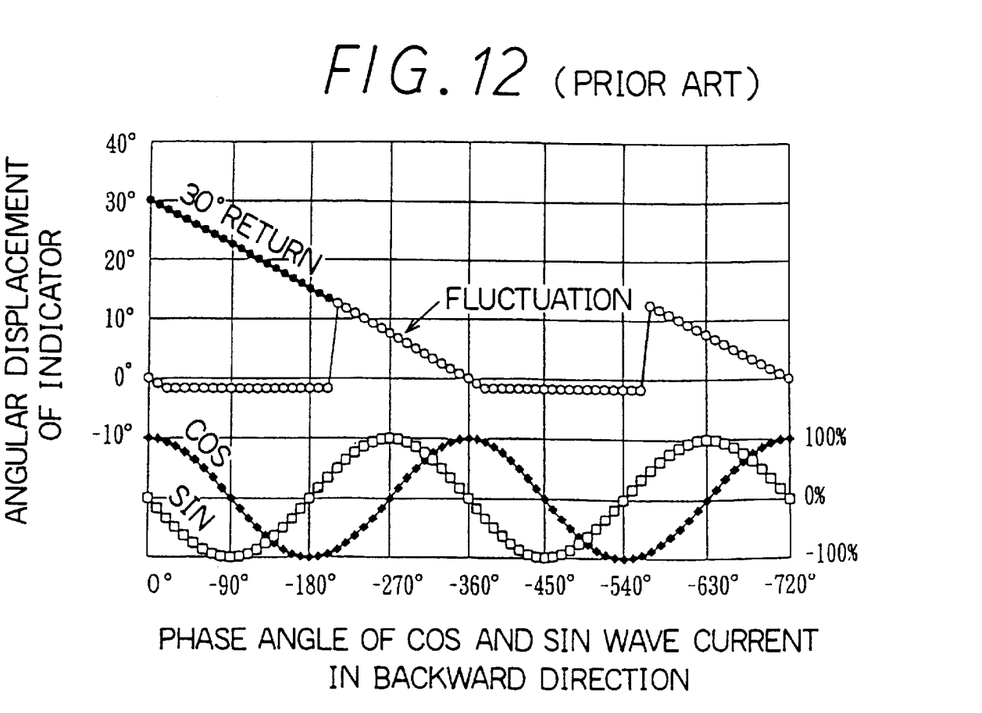
FIG. 12 is a graph showing wave forms of zero-return current supplied to respective windings of the step motor and relationship between angular displacement of the indicator and the phase angle of the zero-return current of a conventional step motor.

For example, if a half cycle (180 degree) of the sinusoidal-wave currents are supplied to the windings when the indicator is returned to the zero position (angle 0° position) from an angle 30° position, the indicator fluctuates between the zero position and repeatedly as shown in FIG. 12, and can not stay at the zero position as long as the sinusoidal wave currents are supplied to the windings.

U.S. Pat. No. 5,287,050 proposes zero-return-control of the indicator in which the zero-return current is cut when abutment of the indicator with the stop is detected from voltage induced across both terminals of the step motor.

However, switching operation of a driving circuit and a voltage detecting circuit are necessary with the result of a complicated structure.

SUMMARY OF THE INVENTION

In view of the above described circumstances, it is a primary object of the present invention to provide an improved indicating instrument and a method of operating an indicating instrument which ensure the zero-return and zero-positioning of the indicator with a simple structure.

Another object of the present invention is to provide an indicator instrument which comprises means for controlling a drive circuit to supply field exciting coils of a step motor with zero-return-current thereby forming a magnetic field to rotate the indicator toward a stopper disposed at a zero-position, and means for preventing a portion of the zero-return current from forming a magnetic field which separates the indicator from the stopper.

The preventing means can be means for cutting a portion of the zero-return-current which forms a magnetic field to separate the indicator from the stopper. Such portion of the zero-return current is generally located in a range of the phase angle between −340 degree and −(180 degree−Δa degree).

The controlling means can be means for controlling the drive circuit to supply the zero-return current to rotate the indicator by a set angle or to supply the zero-return current repeatedly in a set period which is short enough for a driver to overlook fluctuation of the indicator.

A further object of the present invention is to provide an improved method of operating an indicator instrument comprising steps of providing field exciting coils with a cosine wave current and a sine wave current which shift the phase angle by a preset angle when each set time is over, thereby forming a full-range rotating magnetic field rotating in a zero-return direction, and skipping the phase angle of the sine and cosine wave signals from a first angle to a second angle when the sine wave and cosine wave currents are shifted to the first angle so that the indicator can rest on the stopper and will not separated from the stopper by a portion of the rotating magnetic field.

A still further object of the present invention is to provide a method of operating an indicator instrument comprising steps of providing a drive circuit with a cosine wave signal and a sine wave signal which shift phase angle by a preset angle when each set time is over, thereby forming a rotating magnetic field rotating in a zero-return direction, repeating above step a set number of times and stopping the repeating step when the set number of times is over.

A still further object of the present invention is to provide a method of operating an indicator instrument which comprises steps of providing a field exciting coil with zero-return electric current which changes amplitude by a preset level when each set time is over, thereby forming a full-range rotating magnetic field rotating in a zero-return direction, and increasing the preset level when the zero-return electric current forms a portion of the rotating magnetic field which separates the indicator from the stopper.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENT (First Embodiment)

An indicating instrument according to a first embodiment is described with reference to FIG. 1 through FIG. 8.

Figure 2:
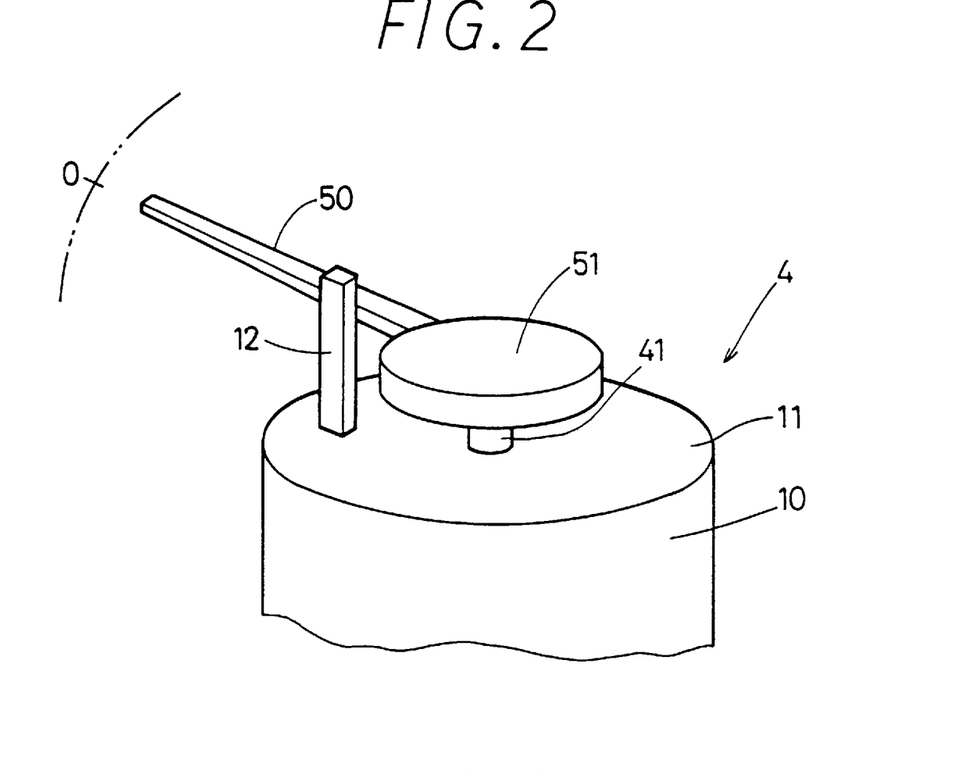
FIG. 2 is a perspective view illustrating a portion of a step motor and an indicator shown in FIG. 1.
Figure 3:
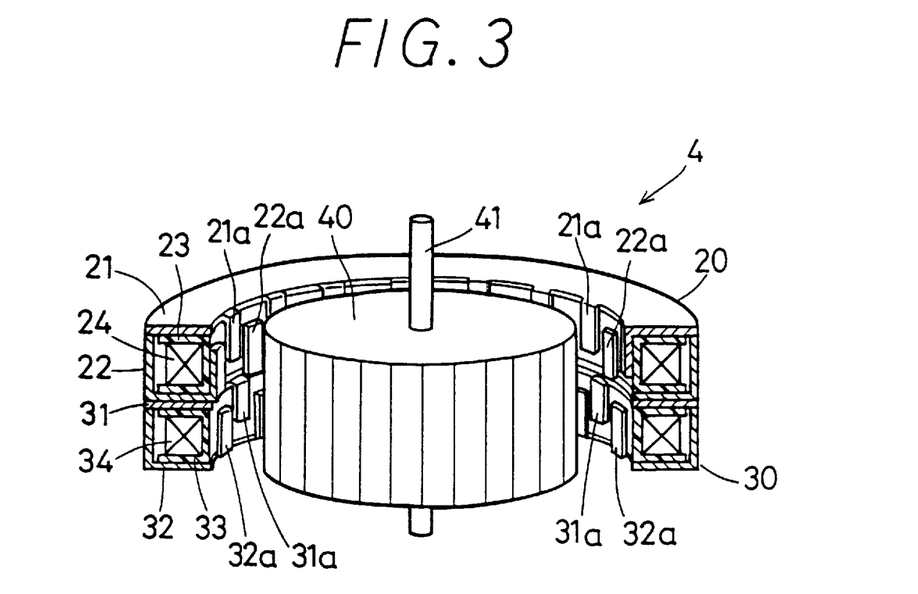
FIG. 3 is a fragmentary sectional view illustrating a stator and a magnet rotor of the step motor shown in FIG. 1.

A step motor 4 has a cylindrical case 10 shown in FIG. 2 and a rotor 40 shown in FIG. 3. The cylindrical case 10 accommodates a pair of upper and lower annular stators 20 and 30 disposed coaxially and has a rod-shaped stopper 12 on an upper wall 11 thereof. The upper stator 20 is composed of a pair of annular upper and lower yokes 21 and 22, which enclose an annular phase coil (hereinafter referred to as A-phase coil) 24 accommodated in a bobbin 23 as shown in FIG. 3. The upper yoke 21 has a flat yoke member and a plurality (twelve, in this embodiment) of pole teeth 21a extending from the inner side of the flat yoke member, and the lower yoke 22 has a yoke member having L-shaped cross section and the same number of pole teeth 22a extending from the inner side of the L-shaped yoke member between the pole teeth 21a at an equal interval (15°, in this embodiment). The pole teeth 21a and 22a are disposed to face the rotor 40 at an air gap.

The lower stator 30 is composed of a pair of upper and lower annular yokes 31 and 32, which enclose an annular phase-coil (hereinafter referred to as B-phase coil) 34 accommodated in a bobbin 33. The upper yoke 30 has a flat yoke member 31 and a plurality (twelve, in this embodiment) of pole teeth 31a extending from the inner side of the flat yoke member 31, and the lower yoke 31 has a yoke member 32 having L-shaped cross section and pole teeth 32a extending from the inner side of the yoke member between the pole teeth 31a at an equal interval (15°, in this embodiment). The pole teeth 31a and 32a are disposed to face the rotor 40 at an air gap.

Figure 4:
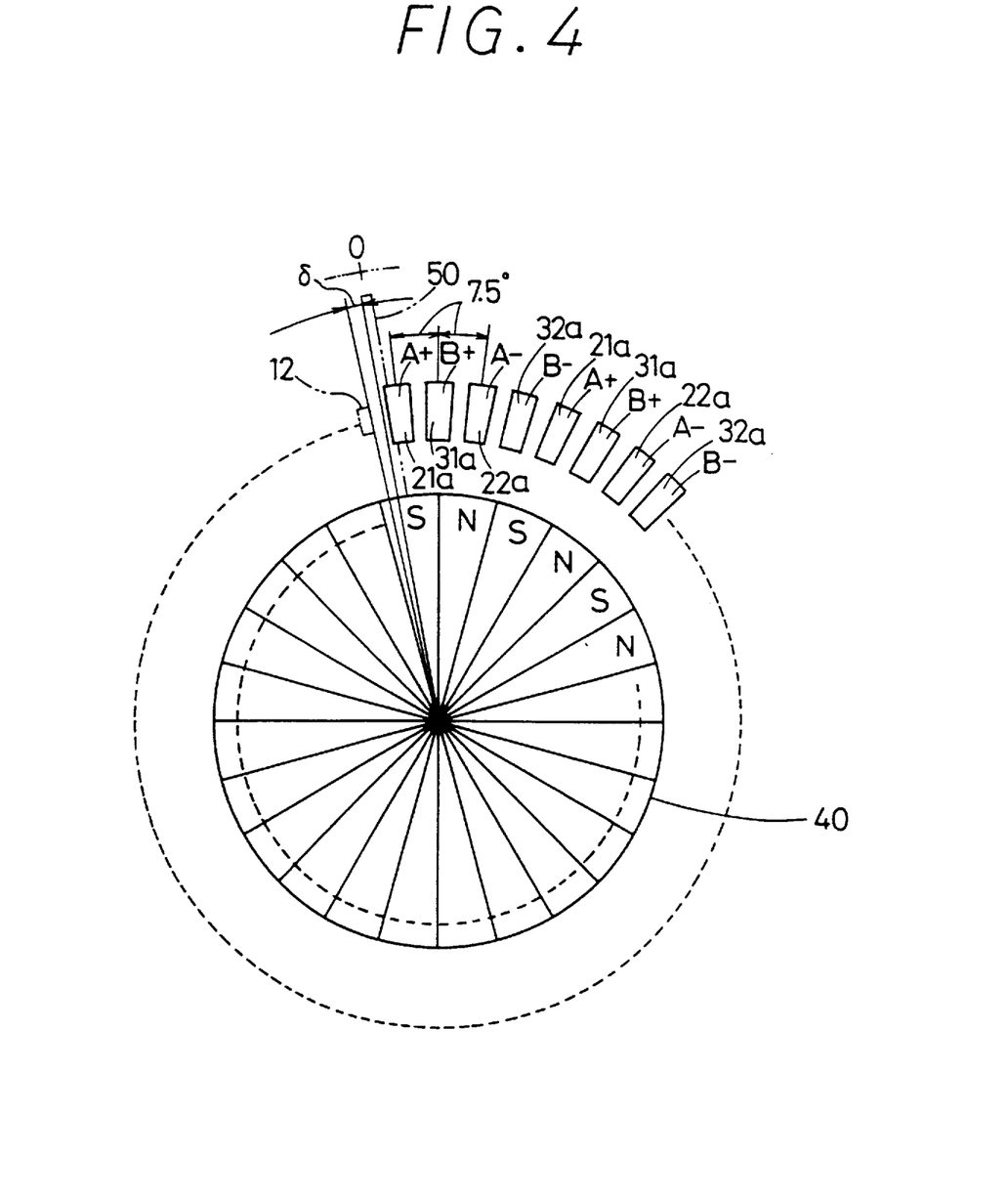
FIG. 4 is a diagrammatic view of the stator and the magnet rotor of the step motor shown in FIG. 1.

Each of the teeth 31a of the lower stator 30 is shifted circumferentially a half of the interval (7.5°, in this embodiment) from an adjacent one of the teeth 21a of the upper stator 20 as shown in FIG. 4. Each of the teeth 32a is also shifted equally from an adjacent one of teeth 22a.

The magnet rotor 40 has an output shaft 41 and a plurality (12, in this embodiment) of N-poled and the same number of S-poled permanent magnets, which are disposed alternately on the outer periphery thereof at an equal interval (15°, in this embodiment). The output shaft 41 is supported by a bearing (not shown) which is secured to a central portion of the upper wall 11 of the cylindrical case 10.

An indicator 50 is supported by a boss member 51 which is carried by an end of the output shaft 41. The shaft 41 extends from the upper wall 11 of the cylindrical case 10 so that the indicator 50 can move over a dial plate (not shown). When the indicator 50 is driven backward by the magnet rotor 40 to return to a zero position of the dial plate, a portion of the indicator 50 is finally caught by the stopper 12 so that an angle δ is formed between the indicator 50 and the zero position as shown in FIG. 4.

When plus current is supplied to the A-phase coil 24, each of the pole teeth 21a indicated by A+ becomes N-pole and each of the pole teeth 22a indicated by A- becomes S-pole, When, on the other hand, minus current is supplied to the A-phase coil 24, each of the pole teeth 21a indicated by A+ becomes S-pole and each of the pole teeth 22a indicated by A- becomes N-pole.

When plus current is supplied to the B-phase coil 34, each of the pole teeth 31a indicated by B+ becomes N-pole and each of the pole teeth 32a indicated by B- becomes S-pole. When, on the other hand, minus current is supplied to the B-phase coil 34, each of the pole teeth 31a indicated by B+ becomes S-pole and each of the pole teeth 32a indicated by B- becomes N-pole.

Thus, when cosine wave current and sine wave current of the normal phase angle are supplied respectively to the A-phase coil 24 and the B-phase 34 at the same time, the magnet rotor 40 which is located in a position shown in FIG. 4 (the S-pole of the magnet rotor face the A+ pole of the stator) is driven forward (clockwise direction in FIG. 4) by 7.5° per each 90° phase angle and, on the other hand, when cosine wave current and sine wave current of the reversed phase angle (the phase starting from 0° toward the minus phase angle as shown in FIG. 12) are supplied respectively to the A-phase coil 24 and the B-phase 34 at the same time, the magnet rotor 40 is driven backward (counter-clockwise direction in FIG. 4) by 7.5° per each 90° phase angle of the sinusoidal waves.

Figure 1:
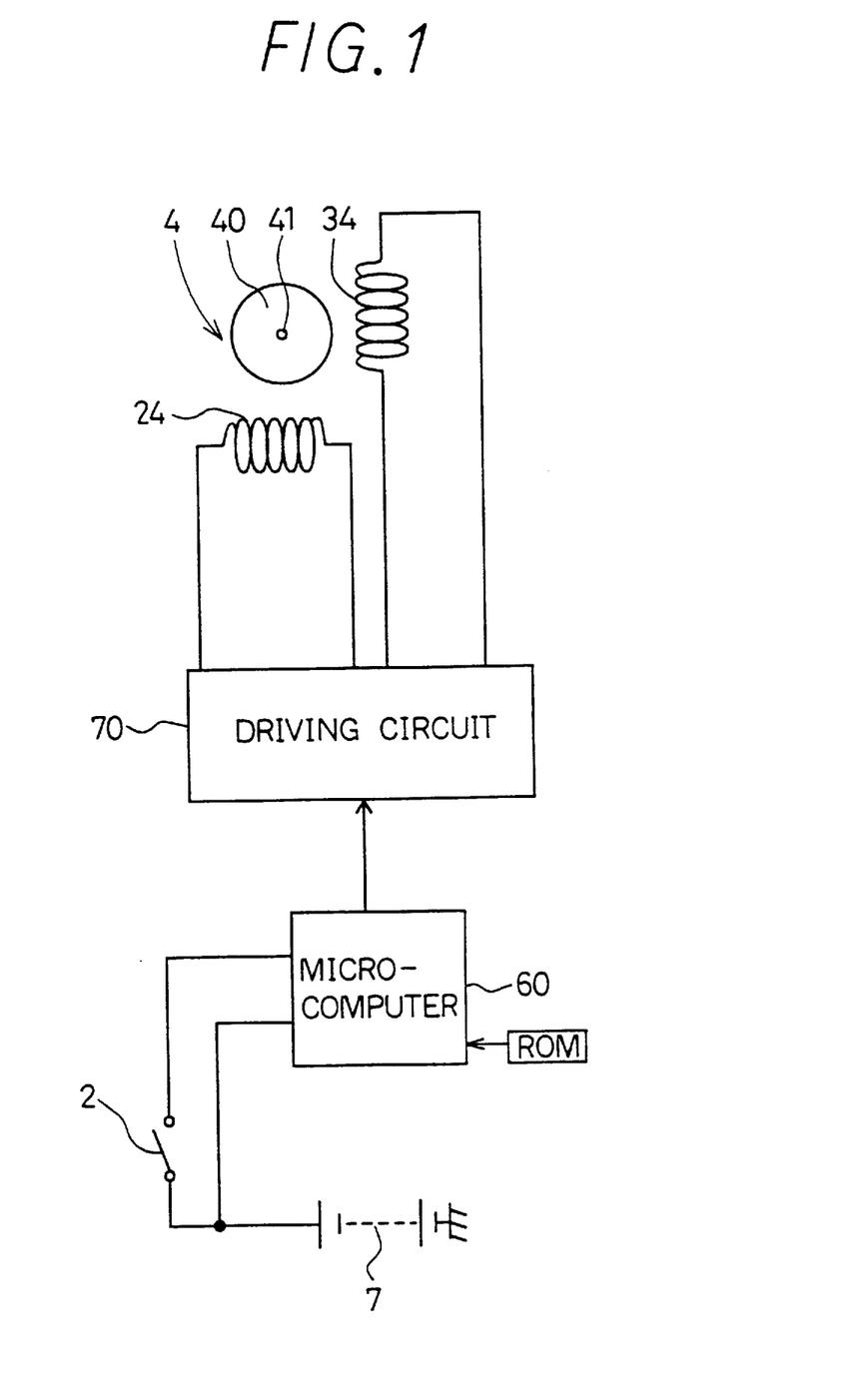
FIG. 1 is block diagram illustrating an indicator instrument according to the present invention.

The indicating instrument has a microcomputer 60 which has a first terminal connected directly to a plus terminal of a vehicle battery 1 and a second terminal connected to the plus terminal of the same battery through an ignition switch 2.

The microcomputer 60 controls a driving circuit 70 which drives the step motor 4 through the A-phase coil 24 and the B-phase coil 34. The microcomputer 60 has a ROM which stores data of relationship between the amplitude in percentage (%) and the phase-angle (each one degree) of the sine-wave and cosine-wave driving currents.

The driving circuit 70 is controlled by the microcomputer 60 to supply the A-phase coil 24 and B-phase coil 34 with the sinusoidal driving currents having the phase different from each other (90 degree for example).

Since the indicator instrument as a speed meter indicates vehicle speed in a well known manner, description of operation of preferred embodiments is made mainly with regard to the zero-return operation hereafter.

Figure 5:
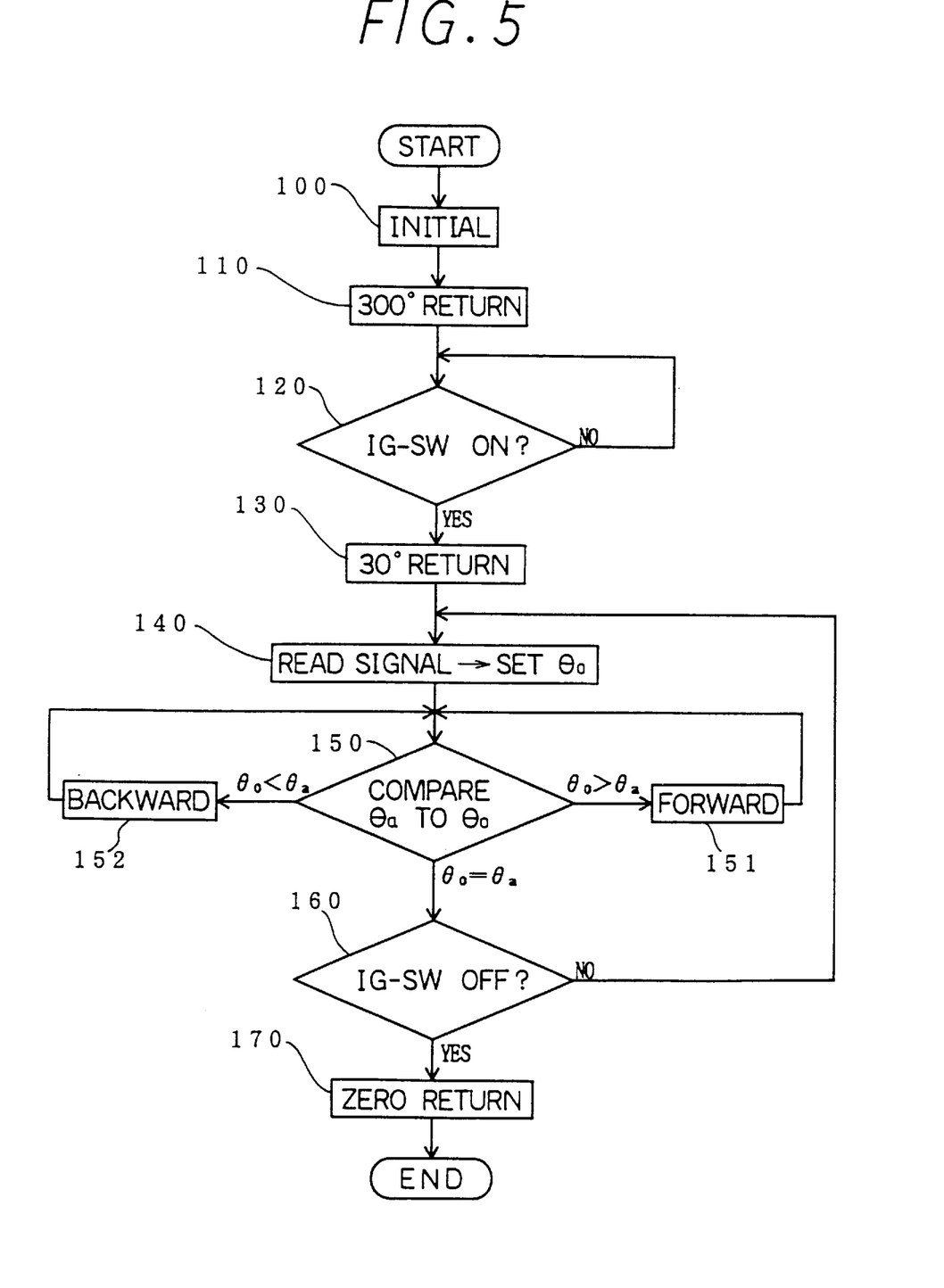
FIG. 5 is a flow chart showing process of a microcomputer of the indicator instrument according to a first embodiment.

The microcomputer 60 starts zero-return operation as shown in FIG. 5 when the indicator instrument is mounted on a vehicle and the micro computer 60 is connected to the plus terminal of the battery 1.

Figure 6:
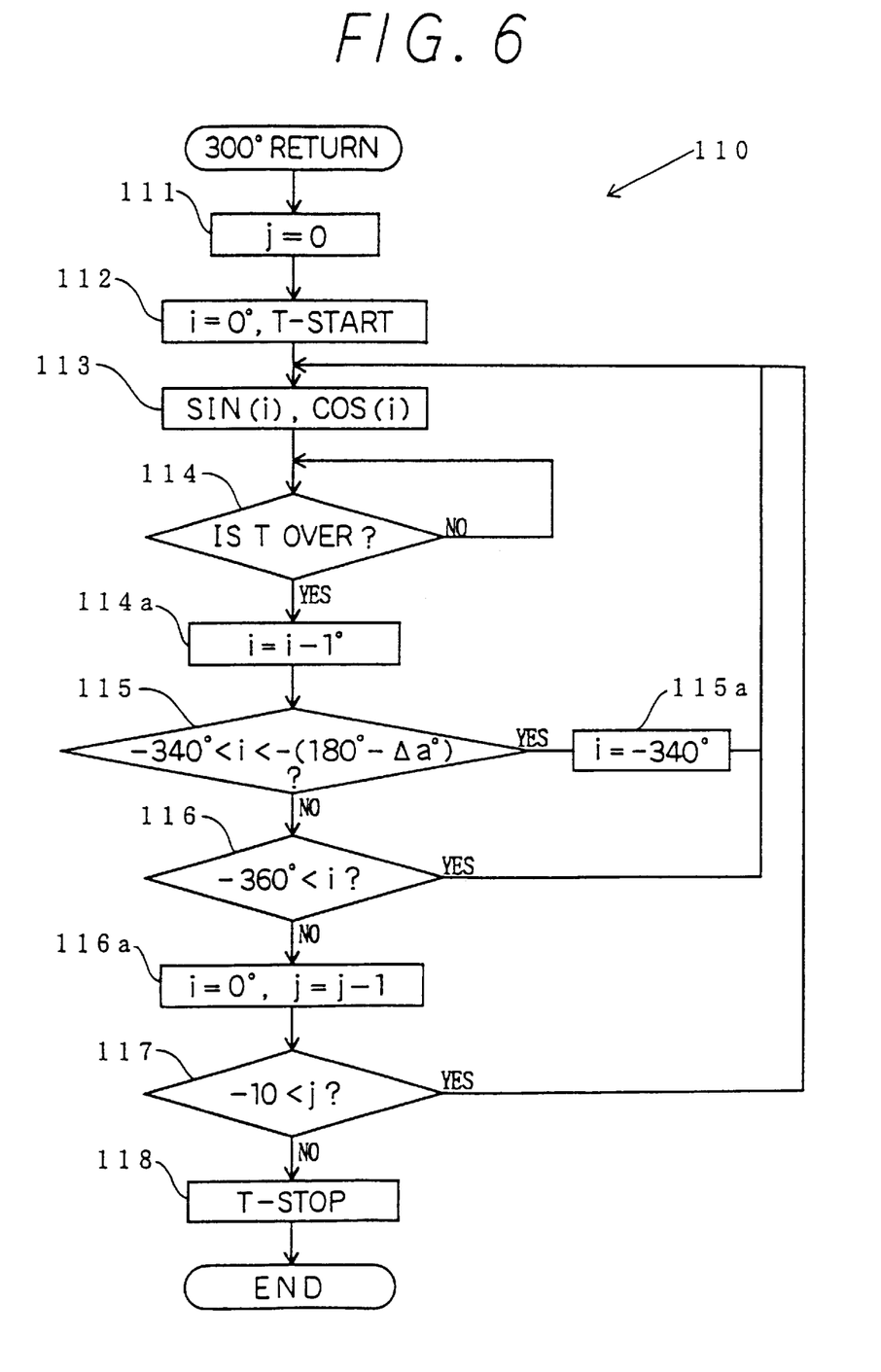
FIG. 6 is a flow chart of a zero-return routine according to the first embodiment.
Figure 8:
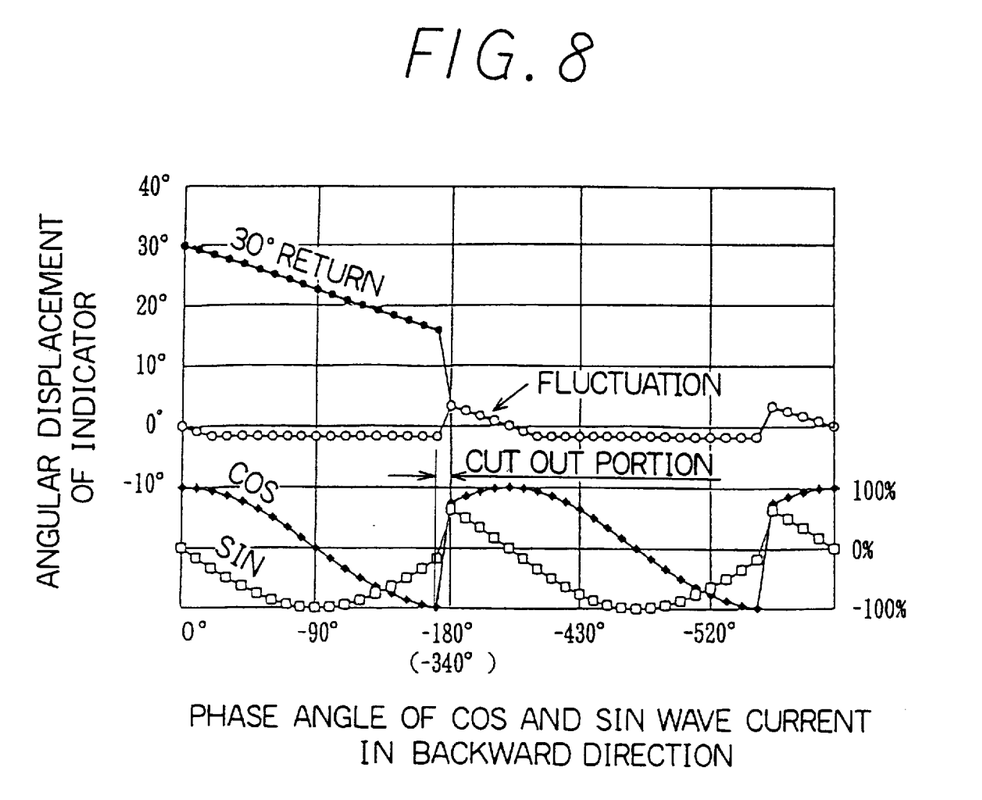
FIG. 8 is a graph showing zero-return currents supplied to respective windings of the step motor each time a set period is over and relationship between angular displacement of the indicator and the phase angle of the zero-return currents according to the first embodiment.

When the operation of the microcomputer 60 starts, a process of initializing is carried out in a step 100 and a routine for zero-return from 300-degree angular displacement of the indicator 50 is executed as shown in FIG. 5 and FIG. 6. It is assumed, here, that the indicator is located at an angle 30° position as shown in FIG. 8. The horizontal axis of a graph in FIG. 8 indicates the phase angle of the cosine curve and sine curve in the reverse direction, however, without a portion which corresponds to a range of the phase angle between 180 degree and 340 degree. Because, the rotating magnetic field generated in the range tends to separate the indicator from the stopper. Phase angles designated as −430° and −520°, which are less than −360°, represent the phase angle of the second turn which correspond respectively to 90° and 180° of the first turn. Incidentally, the same or similar designations appear in the following graphs shown in FIGS. 11 and 12.

The number of zero-return process j of the indicator 50 is set to 0 in a step 111 shown in FIG. 6. Then, a phase angle i is set to 0° and a timer of the microcomputer 60 is set to start in a step 112. Subsequently, the amplitude values of the sine-wave current and the cosine-wave current which corresponds to the phase angle 0 are read from the ROM, and signals corresponding to SIN (i)=SIN (0°)=0% and COS (I)=COS (0°)=100% as shown in FIG. 8 are applied to the driving circuit 70.

When the timer measures a set time T (0.3 msec, for example) for changing the phase angle by 1° in a step 114, YES is determined to proceed to a step 114a, where the phase angle i=i−1°=−1° is set. The set time T is decided so that the indicator can follow in sychronizm with change of the rotating magnetic field generated by the phase coils 24 and 34.

Then, whether or not the phase angle i is in a range between −340° and −(180°−Δa°) is compared in a step 115. This range generally corresponds to the latter half cycle of the sine and cosine wave driving currents. A range between −340° and −360° of the driving currents, however, composes magnetic field to return the indicator to the zero position.

Since the phase angle i is −1° at this moment and Δa° is set smaller than 100° (usually about 45°), NO is determined in this step, and then YES is determined in a step 116 to return to the step 113. The same series of steps 113, 114, 114a, 115 and 116 are repeated and the driving circuit 70 supplies the A-phase coil 24 and the B-phase coil 34 with the sine-wave current and the cosine-wave current each decrease of angle 1° until the step 115 determines YES as shown in FIG. 8.

It is noted that the above steps eliminate the magnetic field which cause the rotor and the indicator 50 to separate from the stopper. As a result, the indicator 50 moves to the zero position without motion of leaving the stopper 12 (fluctuation) as the step motor 4 rotates.

Then, the phase angle i is renewed to i=−340° in a step 115a. Thereafter, the sine-wave current amplitude SIN (−340°) and the cosine-wave current COS (−340°), which correspond to the phase angle i=−340°, is read out of the ROM to control the driving circuit 70, thereby driving the step motor 4 to rotate the indicator 50 toward the stopper 12.

Then, NO is determined in the step 115 and YES is determined in the step 116, and the steps 113, 114, 114a, 115 and 116 are repeated until the phase angle i becomes equal to −360°.

When the phase angle i becomes 360°, NO is determined in the step 116, and the phase angle i is set to 0° and the number of zero-return process j is set to j−1 in a step 116a. Whether the number of zero-return process j is larger than −10 or not is compared in the next step 117. If YES is determined, this means that the 30-degree return processes have been repeated ten times, in other words, 300-degree zero-return has been carried out. Thus, even if the indicator is shifted by an angle 300° or less, the indicator can be returned to the zero-position without motion of leaving the stopper during the zero-return process.

Then, the steps 113 through 117 are repeated until NO is determined (9 times in this case) in the step 117. When NO is determined in the step 117, the timer is stopped in a step 118 and the zero-return process 110 is ended.

The 300-degree-zero-return process is carried out only once in this routine 130 because the indicator 50 of the instrument installed in the vehicle does not shift more from the zero-position than the indicator 50 of the instrument before it is installed.

Figure 7:
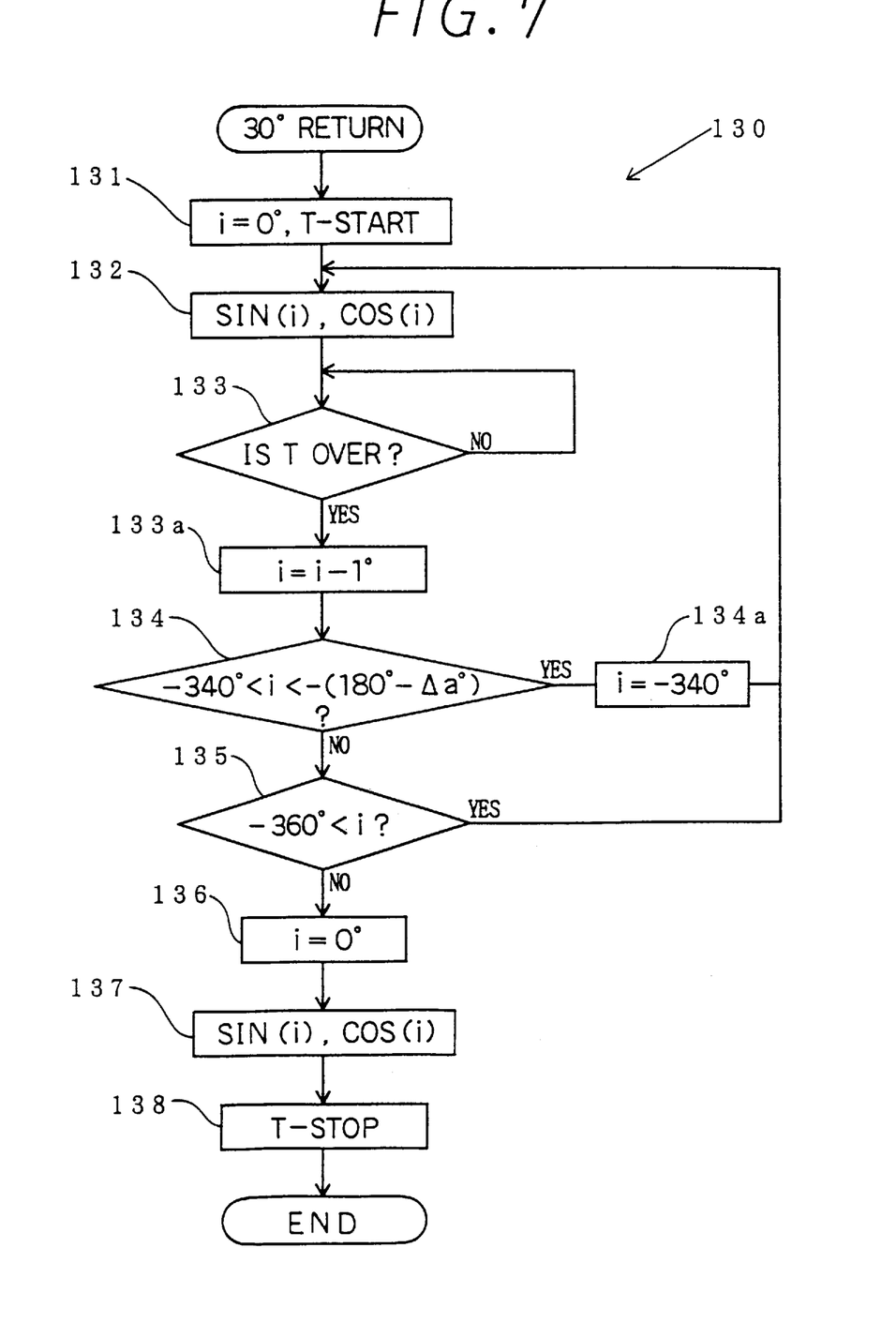
FIG. 7 is a flow chart of a zero-return routine according to the first embodiment.

Thereafter, whenever the ignition switch 2 of a vehicle is turned on, the microcomputer 60 executes a 30-degree-zero-return-process routine 130 as shown in FIG. 5 and FIG. 7.

A series of steps 131 through 135 of the zero-return routine 130 shown in FIG. 7 is substantially the same series of steps 111 through 116 of the zero-return-process routine 110.

When NO is determined in a step 135, the phase angle i is set to 0° in a step 136 and the sine-wave current amplitude SIN (0°) and the cosine-wave current COS (0°), which correspond to the phase angle i=0°, are read out of the ROM so that the driving circuit 70 drives the step motor 4 to hold the indicator 50 at the stopper 12. Then, the timer stops in a step 138 and the zero-return routine 130 is ended.

Although the zero-return routines 110 and 130 control the indicator 50 to return from the angle 30° position, the routine can be applied to the indicator 50 staying in the zero position. In this case, the indicator 50 is controlled in substantially the same manner as above.

After the routine 130, the process proceeds to steps 140 and 150 for the speed indication (forward driving) as shown in FIG. 5, where input signals are read out and set angular displacement $\theta_o$ of the indicator 50 is calculated and, thereafter, a current angular displacement θa is compared with the set angular displacement $\theta_o$ to drive the motor 4 forward (step 151) and backward (step 152) or proceed to a step 160, where whether the ignition switch 2 is turned off or not is detected. When the ignition switch 2 is turned off, YES is determined and the step motor 4 is controlled to bring the indicator 50 to the zero position from the current angular displacement θa.

(Second Embodiment)

Figure 9:
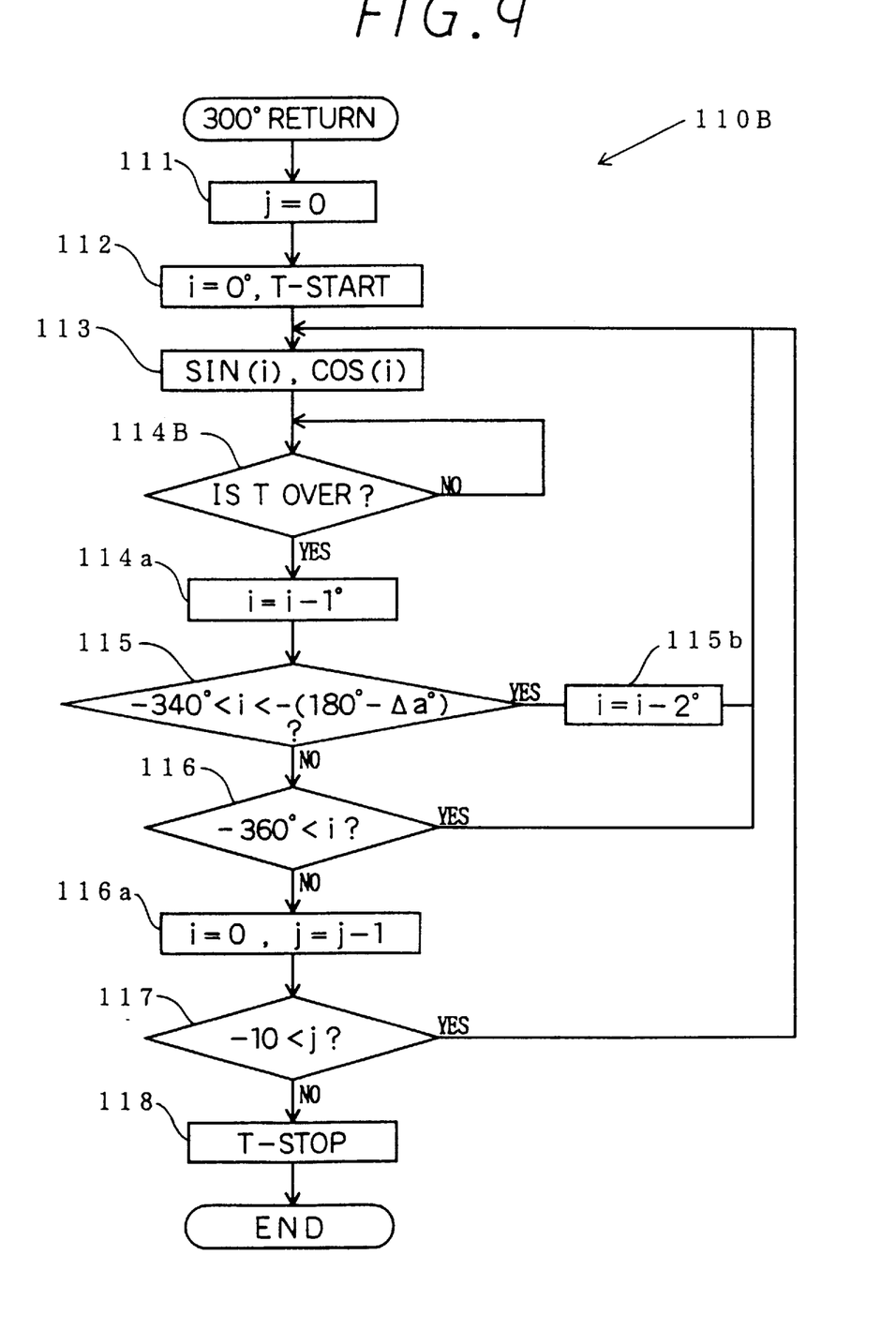
FIG. 9 is a flow chart of a zero-position-return routine according to a second embodiment.
Figure 10:
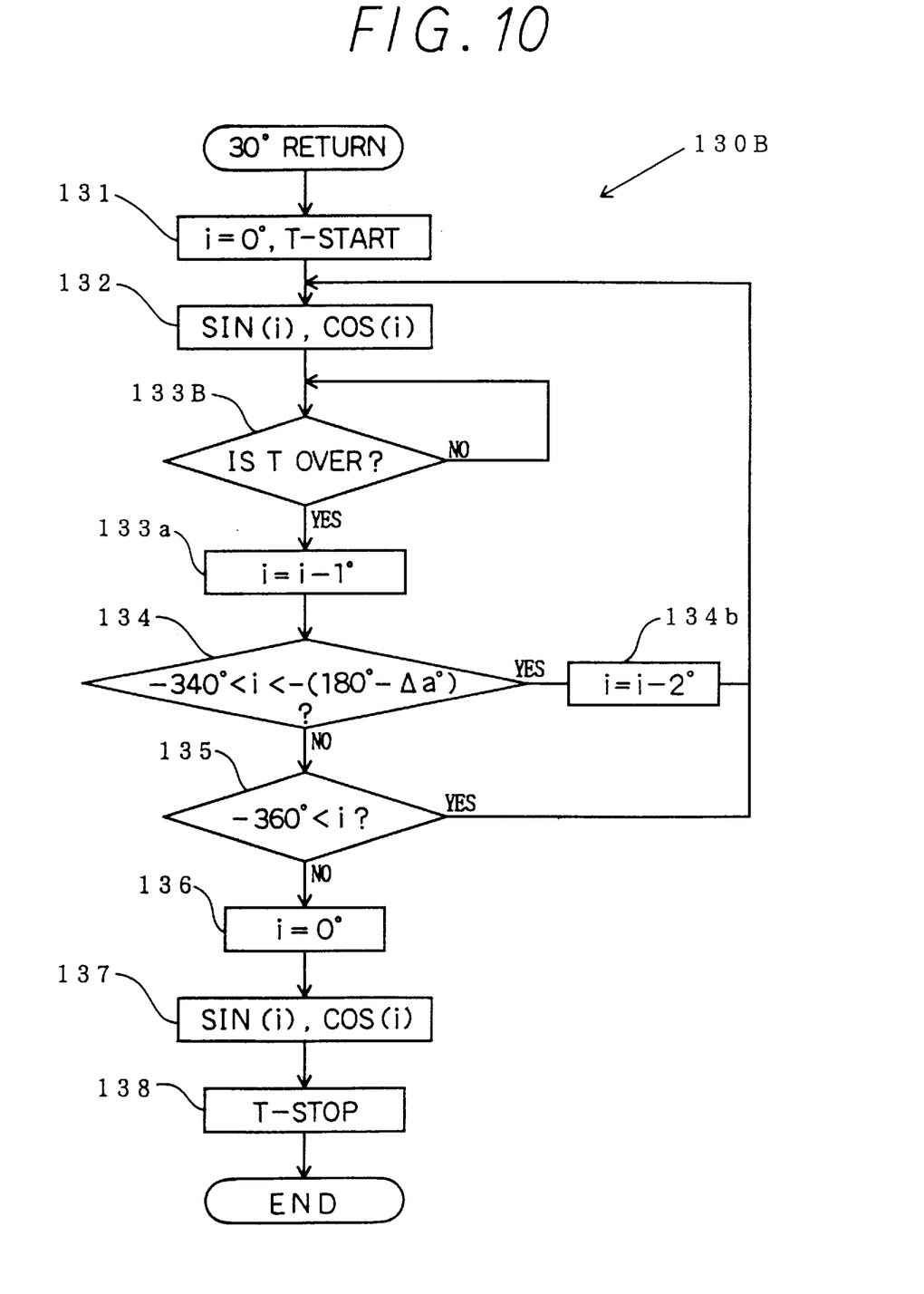
FIG. 10 is a flow chart of a zero-position-return routine according to the second embodiment.
Figure 11:
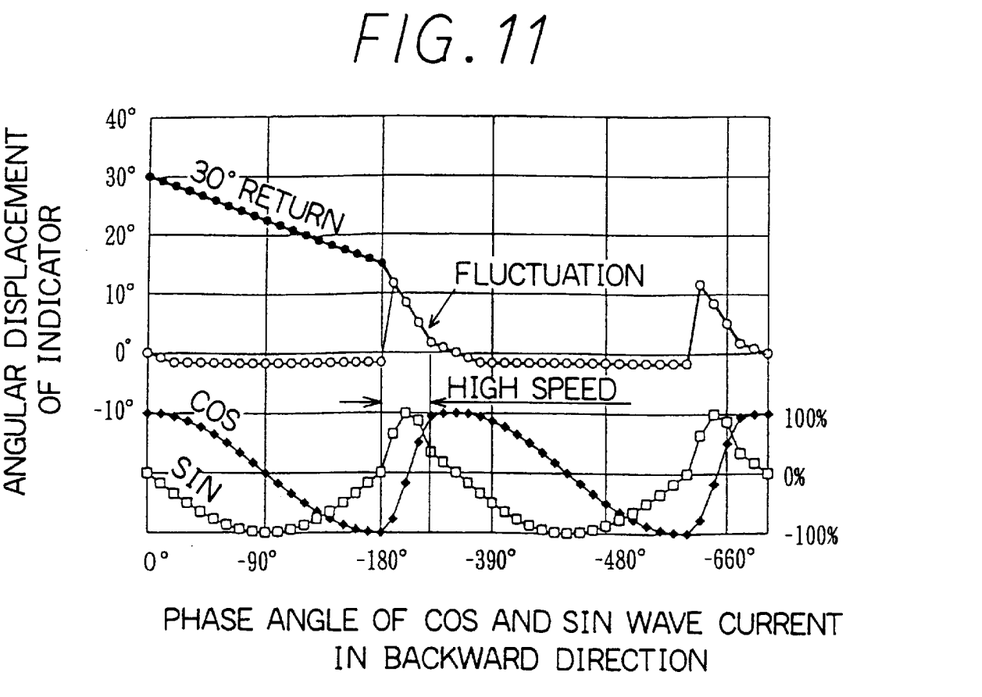
FIG. 11 is a graph showing wave forms of zero-return current supplied to respective windings each time a set period is over and relationship between angular displacement of the indicator and the phase angle of the zero-return current of the step motor according to the second embodiment.

A second embodiment is described with reference to FIGS. 9, 10 and 11. The step 115a of the first embodiment is replaced with 115b in the third embodiment.

While the phase angle i is changing in a range between −340° and −(180°−Δa°), the speed of the zero-return operation of the indicator 50 is increased twice as high as the speed in other ranges so that the fluctuation of the indicator 50 can not be recognized by the driver. Since the indicator is moving, it can follow the increased speed of the zero-return operation. The speed can be increased higher than two times of the speed in other range as far as the indicator can follows the changing cycle of the sinusoidal currents.

(Variation)

The present invention can be applied to three-phase step motor including the permanent magnet type and other hybrid motor types. The present invention can be also applied to a single phase motor if some zero-return-structure is provided.

The sinusoidal control current supplied to the windings can be replaced with other control current such as approximated sinusoidal current, trapezoidal current or the like.

The stopper 12 can be disposed other than upper wall 11 of the cylindrical case 10.

The control steps of the zero-return operation can be put in hard logic elements.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An indicator instrument including a step motor having a pair of field exciting coils and a permanent magnet rotor, an indicator rotatable with said step motor, a drive circuit for intermittently supplying said pair of field exciting coils respectively with different driving currents to form a magnetic field for rotating said permanent magnet rotor stepwise, a control unit for controlling said drive circuit according to a given condition to be indicated by said indicator and a stopper for stopping said indicator at a zero position of said indicator when said indicator is returned to said zero position, wherein said control unit comprises:

means for controlling said drive circuit to supply said field exciting coils with said driving current to rotate said indicator toward said stopper before said indicator is driven to indicate said given condition, and means for skipping a portion of said driving current otherwise forming a portion of said magnetic field which separates said indicator from said stopper after said indicator is stopped by said stopper.

2. An indicator instrument according to claim 1, wherein said controlling means controls said drive circuit to supply said driving current to rotate said indicator toward said stopper by a set angle.

3. An indicator instrument according to claim 2, wherein said controlling means controls said drive circuit in a set period.

4. An indicator instrument according to claim 3, wherein a portion of said set period is sufficiently short for a driver to overlook fluctuation of said indicator caused by said repetition.

5. An indicator instrument including a step motor having a pair of field exciting coils and a permanent magnet rotor, an indicator rotatable with said step motor, a control-current-signal generator for generating control signals according to a given condition to be indicated by said indicator, a drive circuit for intermittently supplying said field coils with driving currents respectively changing along a sine wave curve and a cosine wave curve according to said control signals thereby forming a magnetic field for rotating said permanent magnet rotor stepwise and a stopper for stopping said indicator at a zero position of said indicator when said indicator is returned to said zero position, wherein said control-current-signal generator comprises:

means for generating a signal to control said drive circuit to supply said field exciting coils with zero-return-current thereby forming a composite magnetic field to rotate said indicator toward said stopper before said indicator is driven to indicate said given condition, and means for cutting a portion of said signal which forms driving current otherwise forming a magnetic field to separate said indicator from said stopper after said indicator is stopped by said stopper.

6. An indicator instrument comprising:

a step motor having a pair of field exciting coils and a permanent magnet rotor;

an indicator rotatable with said step motor;

a control-current-signal generator for generating control signals according to a given condition to be indicated by said indicator;

a drive circuit for supplying said field coils with driving currents according to said control signals of said control-current-signal generator thereby driving said permanent magnet rotor stepwise and a stopper for stopping said indicator at a zero position of said indicator when said indicator is returned to said zero position;

means for controlling said drive circuit to supply said field exciting coils respectively with sine and cosine wave currents intermittently so that said field exciting coils form a composite magnetic field to rotate said indicator toward said stopper; and means for cutting a portion of said sine and cosine wave currents so that said indicator may not be separated from said stopper after said indicator is stopped by said stopper.

7. A method of operating an indicator instrument including a step motor having at least two field exciting coils and a permanent magnet rotor, an indicator rotatable with said step motor, a control-current-signal generator for generating control signals according to a given condition to be indicated by said indicator, a drive circuit for supplying said field coils with driving currents according to said control signals of said control-current-signal generator thereby driving said permanent magnet rotor stepwise and a stopper for stopping said indicator at a zero position of said indicator when said indicator is returned to said zero position, said method comprising steps of:

controlling said drive circuit to supply said field exciting coil with a cosine wave drive current and a sine wave drive current to form a rotating magnetic field rotating in a zero-return direction continuously; and skipping a portion of said sine wave and cosine wave driving currents otherwise forming a rotating magnetic field opposite said zero return direction so that said indicator can rest on said stopper and can not leave from said stopper due to a portion of said rotating magnetic field after said indicator is stopped by said stopper.

8. A method of operating an indicator instrument including a step motor having a pair of field exciting coils and a permanent magnet rotor, an indicator rotatable with said step motor, a drive circuit for intermittently supplying different driving currents respectively to said pair of field exciting coils to form rotating magnetic fields to drive said step motor stepwise, and a stopper for stopping said indicator at a zero position of said indicator when said indicator is returned to said zero position, said method comprising steps of:

controlling said drive circuit to supply said field exciting coils respectively with sine wave driving and cosine wave driving currents, thereby forming a complete rotating magnetic field rotating in a zero-return direction; and skipping a range of said sine wave and cosine wave driving currents which form a portion of said rotating magnetic field to make said indicator leave from said zero position so that said indicator can rest on said stopper and not leave from said stopper after said indicator is stopped by said stopper.

9. A method of operating an indicator instrument including a step motor having two field exciting coils and a permanent magnet rotor, an indicator rotatable with said step motor, a control-current-signal generator for generating control signals according to a given condition to be indicated by said indicator, a drive circuit for intermittently supplying said field exciting coils with sine wave and cosine wave driving currents according to said control signals of said control-current-signal generator to form a complete rotating magnetic field to rotate said permanent magnet rotor stepwise and a stopper for stopping said indicator at a zero position of said indicator when said indicator is returned to said zero position, said method comprising steps of:

providing said drive circuit with said control signals to supply a cosine wave driving current and a sine wave driving current to said field exciting coils intermittently;

skipping a portion of said sine wave and cosine wave driving currents corresponding to a portion of said complete magnetic field separating said indicator from said stopper after said indicator is stopped, thereby forming a rotating magnetic field rotating in a zero-return direction;

repeating above skipping step a set number of times; and stopping said repeating step when said set number of times is over.

10. A method of operating an indicator instrument including a step motor having at least two field exciting coils and a permanent magnet rotor, an indicator rotatable with said step motor, a control-current-signal generator generating control signals according to a given condition to be indicated by said indicator at a cycle speed, a drive circuit for supplying said field exciting coils with driving currents according to said control signals of said control-current-signal generator to rotate said step motor stepwise and a stopper for stopping said indicator at a zero position of said indicator when said indicator is returned to said zero position, said method comprising steps of:

providing said drive circuit with control signals to supply a cosine wave driving current and a sine wave driving current, thereby forming a full-range rotating magnetic field rotating in a zero-return direction; and increasing said cycle speed when said cosine wave driving current and said sine wave driving current form a portion of said rotating magnetic field which separates said indicator from said stopper after said indicator is stopped by said stopper.

11. An indicator instrument comprising:

a step motor having a pair of stators each having a multiple pole teeth disposed in a circumference at equal intervals and a pair of field exciting coils and a permanent magnet rotor having multiple magnetic poles respectively corresponding to said pole teeth;

an indicator rotatable with said step motor;

a drive circuit for intermittently supplying said pair of field exciting coils respectively with different driving currents to form a magnetic field for rotating said permanent magnet rotor stepwise;

a stopper for stopping said indicator at a zero position of said indicator when said indicator is returned to said zero position;

a control unit for controlling said drive circuit according to a given condition to be indicated by said indicator, said control unit comprising:

means for controlling said drive circuit to supply said field exciting coils with said drive current to rotate said indicator toward said stopper before said indicator is driven to indicate said given condition, and means for skipping a portion of said driving current otherwise forming a portion of said magnetic field which separates said indicator from said stopper after said indicator is stopped by said stopper.

\* \* \* \* \*